(12) United States Patent
Chiou et al.

(10) Patent No.: US 8,191,423 B2
(45) Date of Patent: Jun. 5, 2012

(54) GROOVED STRUCTURE FOR DIE-MOUNT AND MEDIA SEALING

(75) Inventors: Jen-Huang Albert Chiou, Libertyville, IL (US); Shiuh-Hui Steven Chen, Lake Zurich, IL (US)

(73) Assignee: Continental Automotive Systems, Inc., Deer Park, IL (US)

( * ) Notice: Subject to any disclaimer, the term of this patent is extended or adjusted under 35 U.S.C. 154(b) by 170 days.

(21) Appl. No.: 12/748,739

(22) Filed: Mar. 29, 2010

(65) Prior Publication Data

US 2011/0232389 A1    Sep. 29, 2011

(51) Int. Cl.
*G01L 9/06* (2006.01)

(52) U.S. Cl. ............................................. 73/721; 73/727
(58) Field of Classification Search ............. 73/700–756
See application file for complete search history.

(56) References Cited

U.S. PATENT DOCUMENTS

| 4,790,192 | A | 12/1988 | Knecht et al. | |
|---|---|---|---|---|
| 7,377,177 | B1 * | 5/2008 | Lamb et al. | 73/756 |
| 7,538,401 | B2 * | 5/2009 | Eriksen et al. | 257/419 |
| 7,952,154 | B2 * | 5/2011 | Guo et al. | 257/417 |
| 2004/0231426 | A1 | 11/2004 | Fujimoto et al. | |
| 2007/0089526 | A1 * | 4/2007 | Kurtz et al. | 73/754 |
| 2009/0078054 | A1 * | 3/2009 | Romo | 73/717 |
| 2010/0300207 | A1 * | 12/2010 | Ding et al. | 73/721 |

FOREIGN PATENT DOCUMENTS

| DE | 202008011684 U1 | 12/2008 |
|---|---|---|
| EP | 1376090 A1 | 1/2004 |

OTHER PUBLICATIONS

International Search Report dated Jun. 8, 2011, from corresponding International Patent Application No. PCT/US2011/029405.

* cited by examiner

*Primary Examiner* — Andre Allen (57) ABSTRACT

Dual piezoresistive transducers formed into a single silicon die, are anodically bonded to a pedestal. Two separate pressure ports extend through a plastic housing. The port openings inside the housing are surrounded by a groove having a shape and size that accepts the pedestal. A thin, liquid adhesive is deposited into the groove and allowed to level out. The pedestal is placed into the adhesive and embeds itself therein. Adhesive overflow into the ports is avoided by dimensioning the groove and depositing an amount of adhesive that will fill the groove but not overflow when the pedestal is placed therein. Once the adhesive cures, the adhesive bond strength is greater due to the adhesive being in shear relative to the groove side walls and pedestal sidewalls. The grooved structure provides an apparatus and methodology for precise die mounting and media sealing.

17 Claims, 8 Drawing Sheets

GROOVED STRUCTURE FOR DIE-MOUNT AND MEDIA SEALING

BACKGROUND

Figure 1:
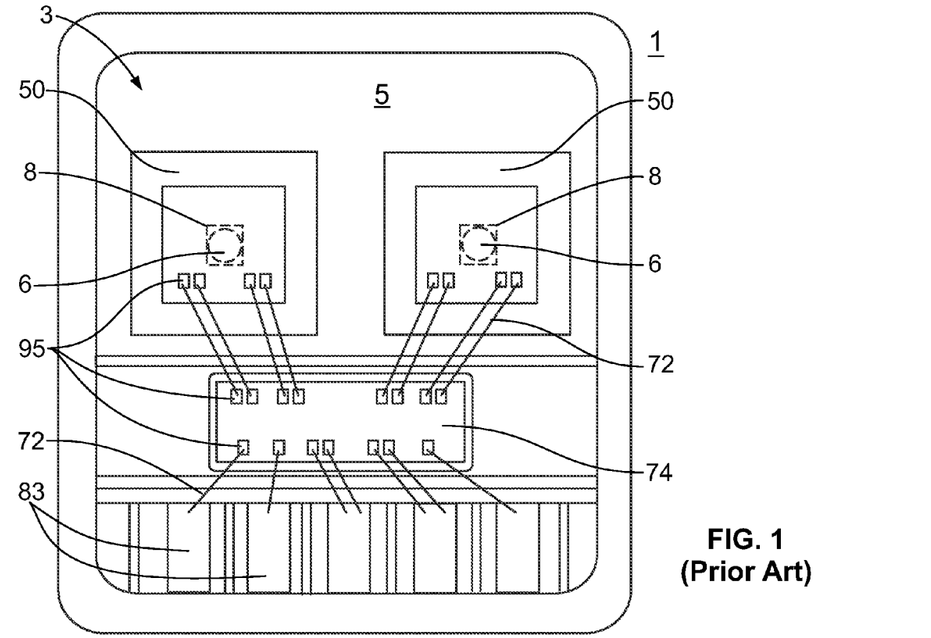
FIG. 1 is a top view of prior art, dual, differential pressure sensor.
Figure 2:
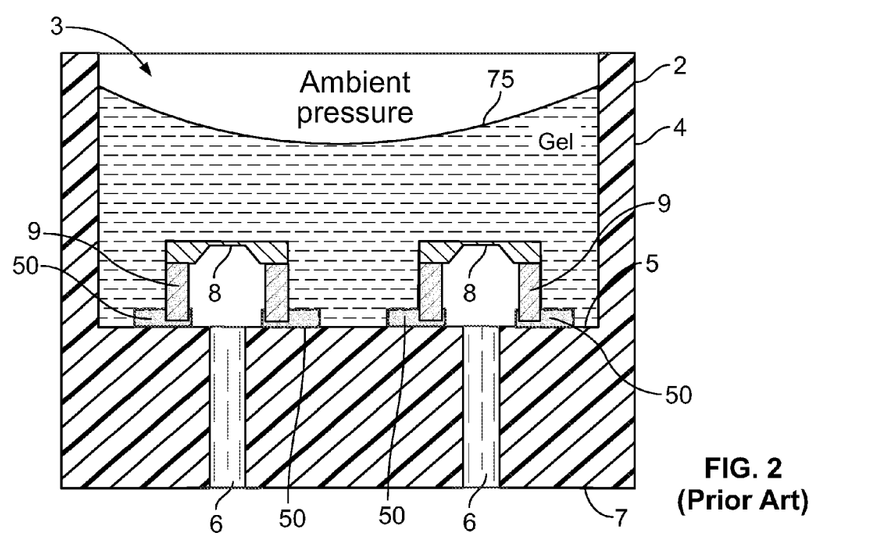
FIG. 2 is a cross-sectional view of the device shown in FIG. 1.

FIG. 1 and FIG. 2 are top and cross-sectional views respectively of a prior art, dual, differential pressure sensor 1. The pressure sensor 1 is referred to as a dual differential pressure sensor because it includes two separate differential pressure sensing transducer dies. Each transducer die is a differential pressure sensor.

As used herein, the term differential pressure sensor refers to a pressure sensor that measures or senses an amount by which the pressure existing in a liquid or gas differs from a reference pressure, typically atmospheric pressure. The device shown in FIG. 1 and FIG. 2 is therefore able to measure two differential pressures, e.g., the pressure on two different liquids or the pressure drop at two differential pressures along a flow path and, provide two corresponding output signals that are representative of the differences between the two measured pressures and a reference pressure.

The pressure sensor 1 is comprised of a housing 2 with a pocket 3 formed by or defined by a vertical side wall 4 that wraps around the pocket 3. The pocket 3 has an open top and a planar or substantially planar bottom surface 5. Two small ports 6, which are visible in the cross-sectional view of FIG. 2, extend from an exterior bottom surface 7 of the housing 2, "upwardly" as shown in FIG. 2 and into the pocket 3 through the planar bottom surface 7. Two separate piezoresistive transducer (PRT) dies 8, which are well known in the sensor art, are mounted on separate, corresponding pedestals 9. The pedestals 9 rest in a bead of adhesive 50, which surrounds each port 6.

The adhesive 50 has an uncured liquid state and a substantially solid cured state. Uncured adhesive is applied to the top of the planar bottom surface 5 as a bead of liquid. The adhesive 50 is applied so that it completely surrounds both ports 6. The pedestals 9 with the PRT dies pre-attached to them are placed on top of the bead of adhesive 50 before the adhesive 50 cures. The pedestals 9 thus settle into the uncured adhesive 50. When cured, the adhesive 50 mechanically bonds the pedestals 9 to the planar bottom surface 5. It also provides a seal between the planar top surface 5 and the pedestal 9.

A viscous gel 75 partially fills the pocket, substantially as shown. The gel 75 protects the PRT dies but it also allows ambient pressure to be applied to the upward facing side of the PRTs, i.e., the side of the PRTs facing ambient pressure.

The gel 75 is viscous but flexible enough to allow ambient air pressure to exert a downward force on the top side of the PRT dies 8. The aforementioned ports 6 carry a media upwardly as shown, the pressure of which exerts an upward force on the PRT dies. The PRT dies are thus subjected to two forces: ambient pressure and the pressure inside the corresponding ports 6. The PRTs measure the difference between those two pressures and are thus referred to as differential pressure sensors.

A problem with the prior art pressure sensor shown in FIGS. 1 and 2 is that the cross-sectional area of the ports 6 is small. If too much of the viscous but nevertheless liquid adhesive 50 is applied around the ports 6, it can roll into one or both ports 60, partially or even completely blocking the port or ports 6. Once the adhesive 50 cures inside a port 6, the adhesive 50 cannot be easily removed from the port 6, without damaging the device 1. A second and related problem is that while many users of the device 1 prefer the overall dimensions to be reduced, reducing the overall size of the device tends to increase the likelihood that adhesive will fall into the ports 6. Reducing the size of the device 1 and keeping the ports 6 clear of adhesive 50 during assembly is therefore problematic.

The problem of adhesive overflow into the ports could be solved by increasing the space or distance between the ports 6 and the adhesive 50 but increasing the space between the ports 6 and the adhesive 50 would require the overall size of the device 1 to be increased. Unfortunately, the trend in all fields of electronics, including pressure sensing, is to make devices smaller rather than larger. A pressure sensor having two or more separate PRTs and which has a reduced size but which also can avoid or eliminate adhesive 50 blocking the pressure ports 6 would be an improvement over the prior art. Another manufacturing process advantage is that a single PRT die 60 with two PRTs can reduce eight bond pads to six bond pads 95, which also reduces the number of connecting wires to the die from eight to six.

DETAILED DESCRIPTION

Figures 3, 4:
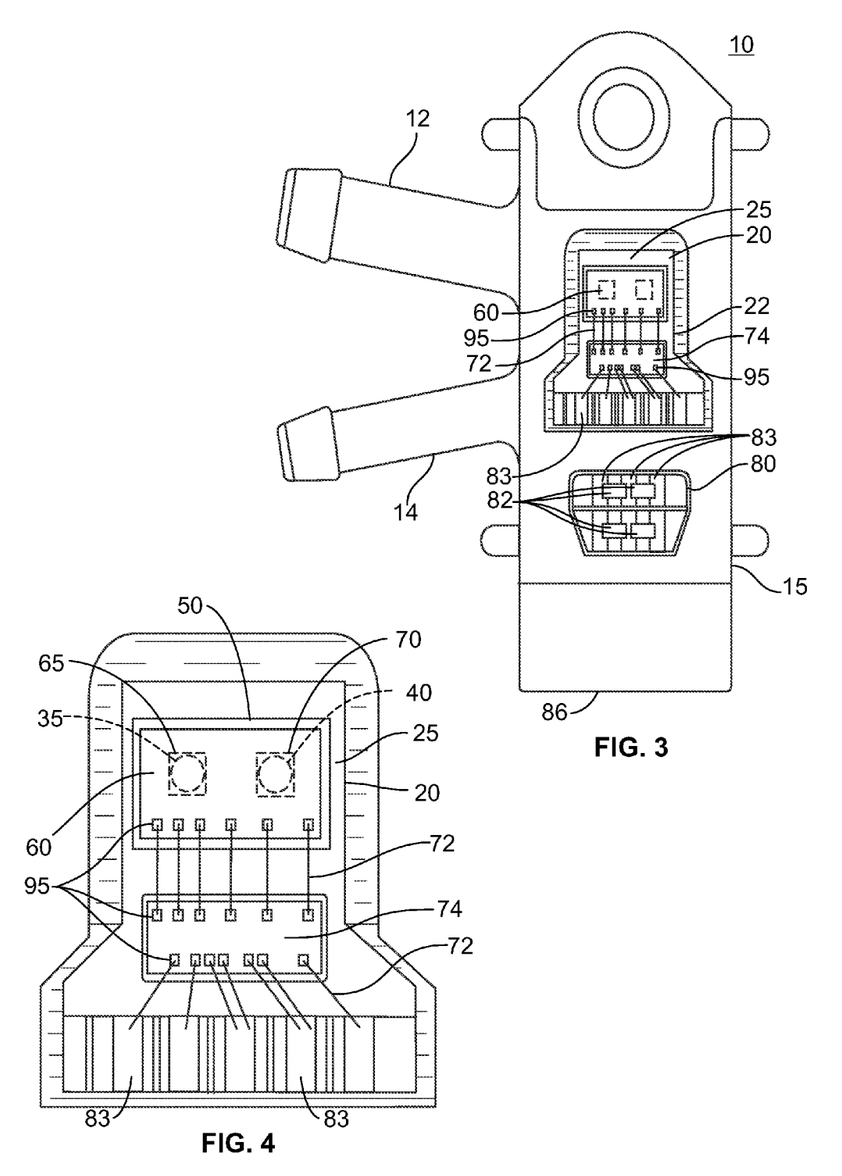
FIG. 3 is a top view of a preferred embodiment of a dual, differential pressure sensor having two piezoresistive transducers on a single die, the die being located and mounted in a groove.
FIG. 4 is a view of a pocket of the device shown in FIG. 3.

FIG. 3 is a top view of a dual differential pressure sensor 10. FIG. 4 is an enlarged, isolated view of the interior of the pressure sensor 10.

FIG. 3 shows that the pressure sensor 10 is comprised of a single silicon die 60 having two piezoresistive transducers formed therein. The die 60 is mounted inside a pocket 20 formed in an injection-molded plastic housing 15.

The die 60 is bonded to a pedestal, not visible in FIG. 3, but which sits within a slot or groove formed in the bottom surface 25 of the housing 15. The groove, which is not visible in FIG. 3, completely surrounds two pressure ports, which are also not visible in FIG. 3.

The pedestal, which sits within the groove, also surrounds both ports. Two pressure inlet ports 12 and 14 extend from one side of the housing 15 and carry pressurized fluids (liquids or gases) to corresponding pressure ports 35 and 40, not visible in FIG. 3 or FIG. 4.

FIG. 4 is a close-up view of the inside of the pocket 20 formed inside the housing 15. Two PRTs, which are not visible in FIG. 4 due to their size, are formed into separate and corresponding thin diaphragms 65 and 70, which are themselves formed into a single silicon die 60. The die 60 and its included PRTs that are formed into corresponding diaphragms 65 and 70, sits at the bottom of the pocket 20 defined by vertical side walls 22 that extend upwardly from the bottom planar surface 25 of the pocket 20. Electrical connections between the PRTs and an application specific integrated circuit 74 (ASIC) are made possible by small lead wires 72 extending from the silicon die 60 to the ASIC 74. The ends of the lead wires 72 are attached to bond pads 95, which are on both the silicon die 60 and the ASIC 74. Lead wires 72 extend from the ASIC 74 to lead frames 83 which are electrically connected to an external power source.

As shown in FIG. 3, a second pocket 80 is formed in the housing 15 to provide access to lead frames 83 that extend from inside a connector port 86 and which provide electrical connection to ASIC 74 in the first pocket 20. So-called chip capacitors 82 or chip caps are connected between lead frames 83 to help suppress electromagnetic interference (EMI). The capacitors 82 are known to those of ordinary skill in the electronic art as "chip caps."

Figure 5:
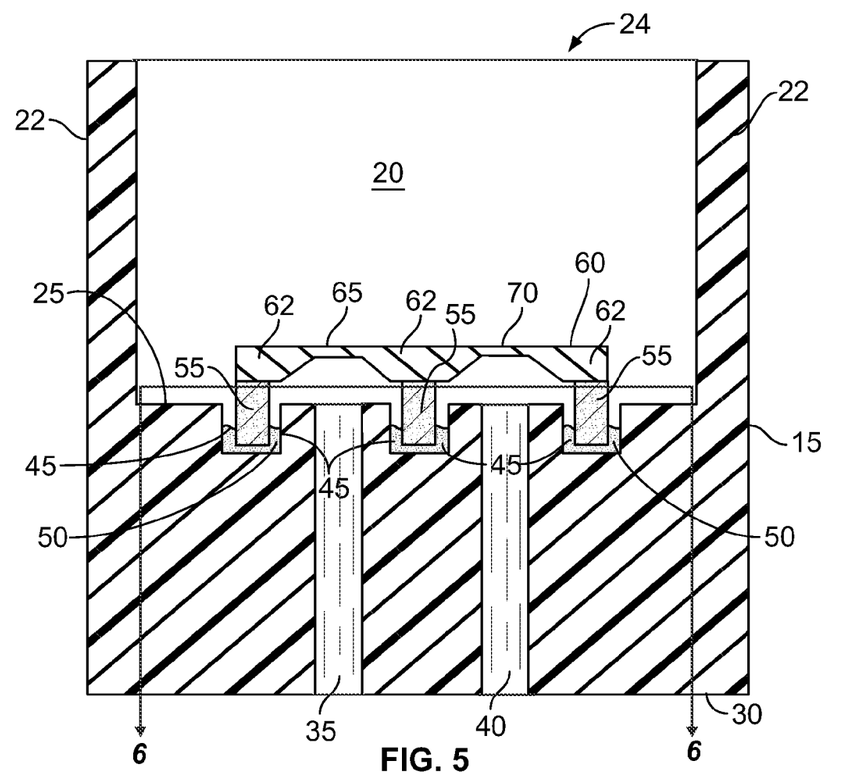
FIG. 5 is a cross-sectional view of the device shown in FIG. 3 and FIG. 4.

FIG. 5 is a cross-sectional view of the housing 15 shown in FIG. 4, taken through the first pocket 20. The injection-molded plastic housing 15 is formed to have vertical side walls 22 that surround and therefore define an open interior pocket 20 accessible through an opening 24 in the "top" of the pocket 20.

The pocket 20 has a bottom surface 25, which is preferably planar or at least substantially planar. A first pressure port 35 extends through the housing 15 from a bottom and exterior surface 30 of the housing 15, upwardly (as shown in the figure) through the planar bottom surface 25. A second pressure port 40, which is laterally displaced from and preferably parallel to the first port 35 extends through the bottom and exterior surface 30 of the housing 15 upwardly through the planar bottom surface 25.

Two diaphragms 65 and 70 are formed into the one die 60, with each of the diaphragms 65 and 70 located above a corresponding pressure port 35 and 40. Each diaphragm 65 and 70 is therefore responsive to pressure in a corresponding pressure port 35 and 40 because of the seal provided around each diaphragm by the bond between the pedestal and the die 60. Each diaphragm has a corresponding piezoresistive transducer (See 91 and 92 in FIG. 16.) formed into it and located proximate to an edge of the diaphragm whereby pressure in a pressure port (35 or 40), acts on a corresponding diaphragm (65 or 70) causing the corresponding transducer to generate a signal representative of the diaphragm deflection. Electrical signals from the PRTs are detected by circuitry in the aforementioned ASIC 74.

Figure 8:
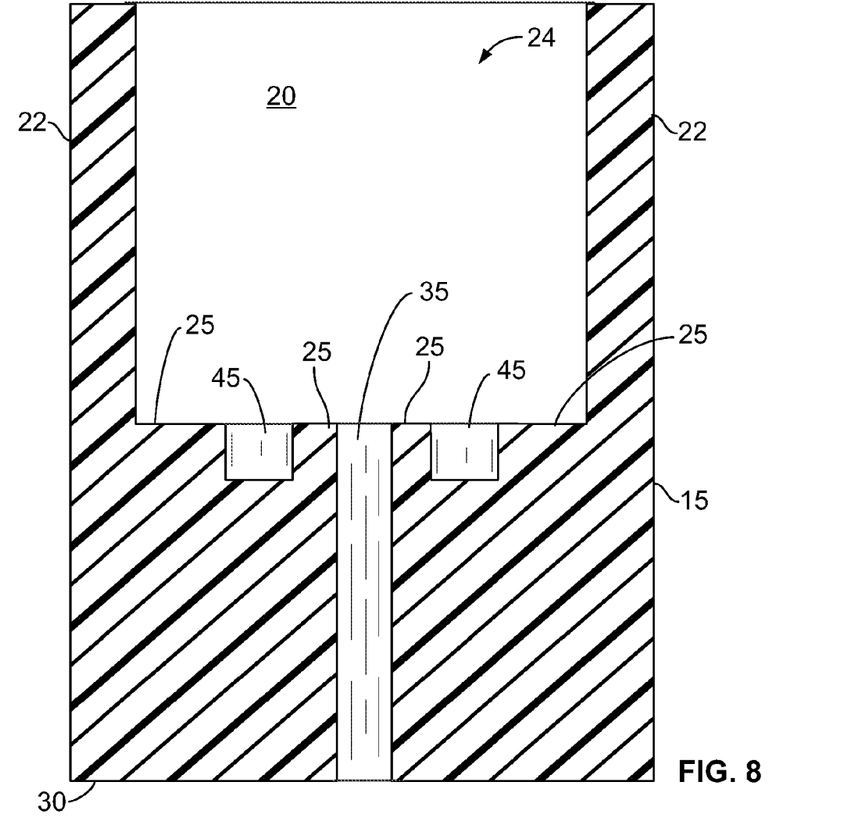
FIG. 8 is a cross sectional view of the housing used with a single, differential pressure sensor showing the housing prior to assembly of a pedestal and die.

The diaphragms 65 and 70 are sized, shaped and arranged such that they are functionally and structurally isolated from each other by relatively thick mounting boss areas 62 of the die 60 and which surround each diaphragm. The increased thickness of the mounting bosses 62 relative to the thin diaphragms 65 and 70 provide a mechanically robust mechanical interface and bonding surface to the glass pedestal 55. In a preferred embodiment, the pedestal 55 and die 60 are anodically bonded together. When viewed from the top as shown in FIG. 8, the resultant structure appears to be a single sheet of silicon die 60, which is cut from a silicon wafer.

The groove 45 discussed above is shown in cross section in FIG. 5 and identified by reference numeral 45, has a substantially rectangular cross section. It is preferably formed into the bottom surface 25 during the injection molding process; however, the groove can be formed after the injection molding of the housing by machining the groove 45 into the bottom surface 25. Regardless of the method of forming the groove, 45, the groove 45 is formed such that it completely surrounds the first port 35 and completely surrounds the second port 40, or at least portions of the ports, where the ports 35 and 40 pass through the bottom 25. Stated another way, the exit of each port 35 and 40 through the bottom surface 25, is completely surrounded by a uniform-depth groove, having a rectangular or substantially-rectangular cross section and which is formed into the bottom surface 25 of the pocket 20.

Figure 6:
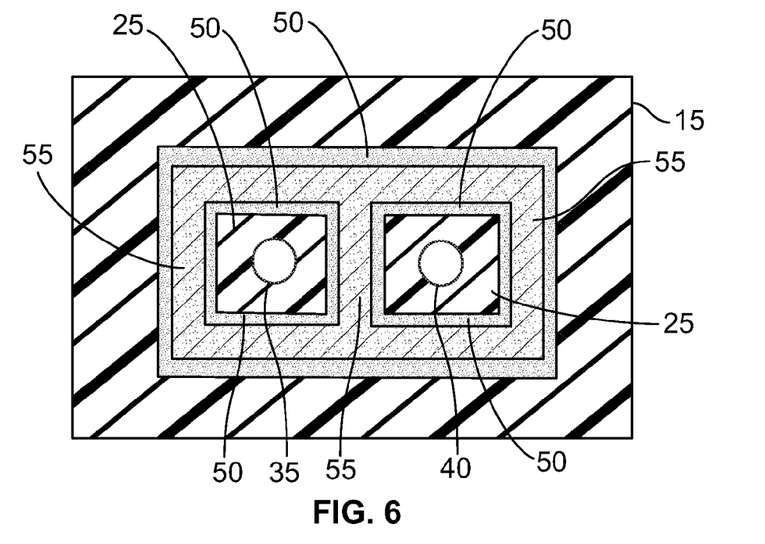
FIG. 6 is a top view of the structure shown in FIG. 5, taken through section lines 6-6.

FIG. 5 also shows in cross section, the aforementioned glass pedestal 55, which is sized, shaped and arranged to loosely fit within the groove 45. As can be seen in FIG. 6, which is a view of the structure shown in FIG. 5 through section lines 6-6, the glass pedestal 55 has a shape reminiscent of the number 8 as shown in FIG. 6 and completely surrounds the first port 35 and completely surrounds the second port 40.

Referring again to FIG. 5, the pedestal 55 is at least partially embedded in an adhesive 50 material, which is deposited into the groove 45 prior to placement of the pedestal 55 into the groove 45. The adhesive 50 preferably has a relatively low viscosity in its uncured state in order that it be able to flow through-out the groove 45 prior to placement of the pedestal 55 into the groove. Once the adhesive flows throughout the groove, placement of the pedestal 55 into the groove 45 results in the pedestal 55 being at least partially embedded into the adhesive 50 prior to its curing. Adhesive material 50 can be seen in FIG. 5 extending upward from the bottom of the groove 45 by a small distance and in direct contact with the vertical side wall of the pedestal 55 and the vertical sidewall of the groove 45. Once the adhesive 50 cures, the adhesive's attachment to the vertical sidewalls of the groove and vertical sidewalls of the pedestal provide for an improved bond, i.e., one that provides more shear strength than would be possible with the structure shown in FIG. 1 and FIG. 2.

The groove 45 dimensions, namely its width, depth, and cross-sectional shape are selected along with the volume of adhesive 50 deposited therein, such that when the pedestal 55 is embedded into the adhesive within the groove, no adhesive flows out of the groove 45 and onto the planar top surface 25. By forming a groove structure 45 in the planar bottom surface 25, and only partially filling it with a liquid adhesive, the pedestal 55 can be precisely located relative to the ports 35 and 40 while avoiding adhesive spill-over at the same time that an enhanced-strength bond is formed. Even more importantly, a single die 60 with two PRTs can be mounted into the groove 45 thereby reducing the overall size of the resultant apparatus 10.

Figure 7:
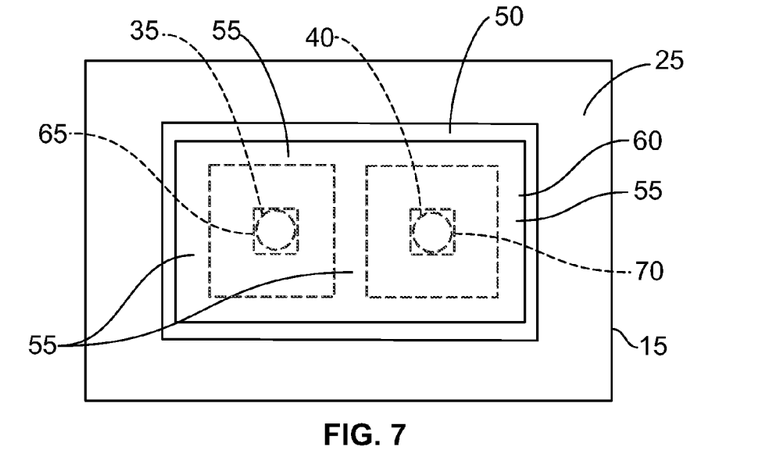
FIG. 7 is a top view into the pocket shown in FIG. 5.

FIG. 7 is a top view into the pocket shown in FIG. 5. As stated above, the silicon die 60 is attached to the pedestal 55 prior to the placement of the pedestal 55 into the groove 45 and adhesive 50. FIG. 7 shows that the single die 60 having two diaphragms 65 and 70 requires less space than do the two separate devices shown in FIG. 1 and FIG. 2.

Figure 13:
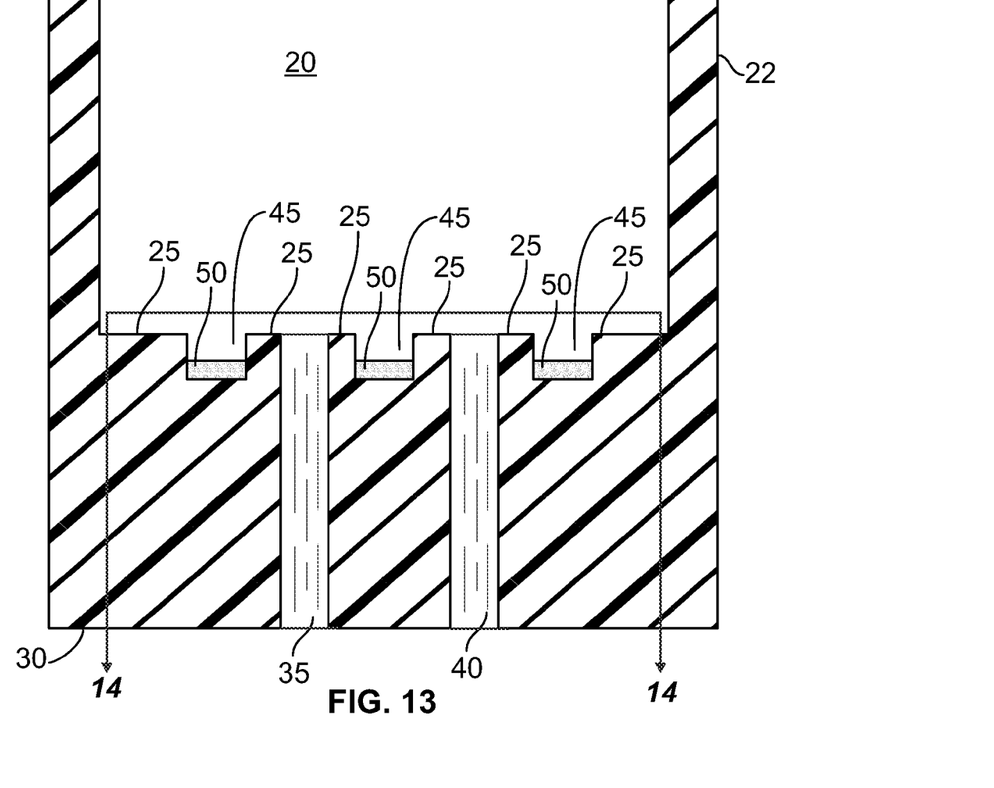
FIG. 13 shows an assembly step, which includes the addition of liquid adhesive into the groove so that it completely surrounds the ports.
Figure 14:
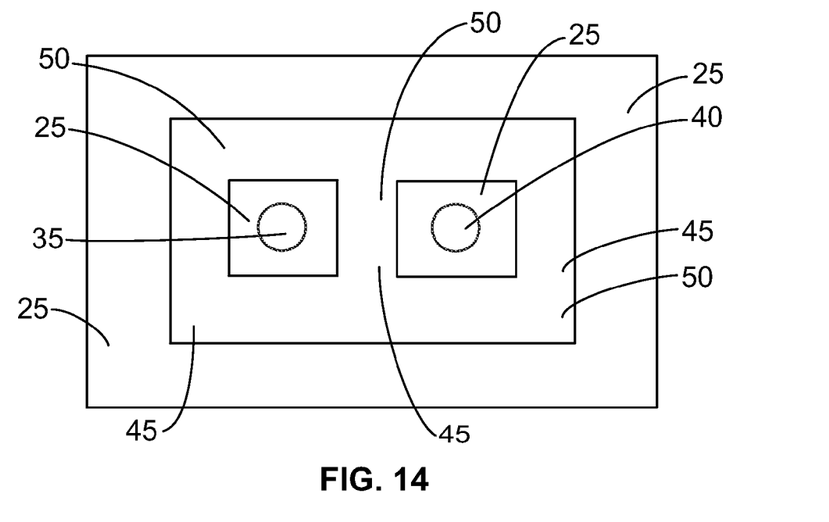
FIG. 14 is top view of the structure shown in FIG. 13.

FIG. 13 and FIG. 14 are cross-sectional and top views respectively of the housing 15 and grooves 45 of FIG. 3 and FIG. 4, partially filled with adhesive 50. They illustrate how the apparatus shown in those figures can be assembled. No die or pedestal is shown in either FIG. 13 or FIG. 14. In FIG. 13, the groove 45 is partially filled but FIG. 13 also shows that the depth of the liquid adhesive 50 in the groove 45 is uniform or at least substantially uniform through-out the groove 45. FIG. 14 shows that both the groove and the adhesive therein, completely surround the ports 34 and 45.

Figure 15:
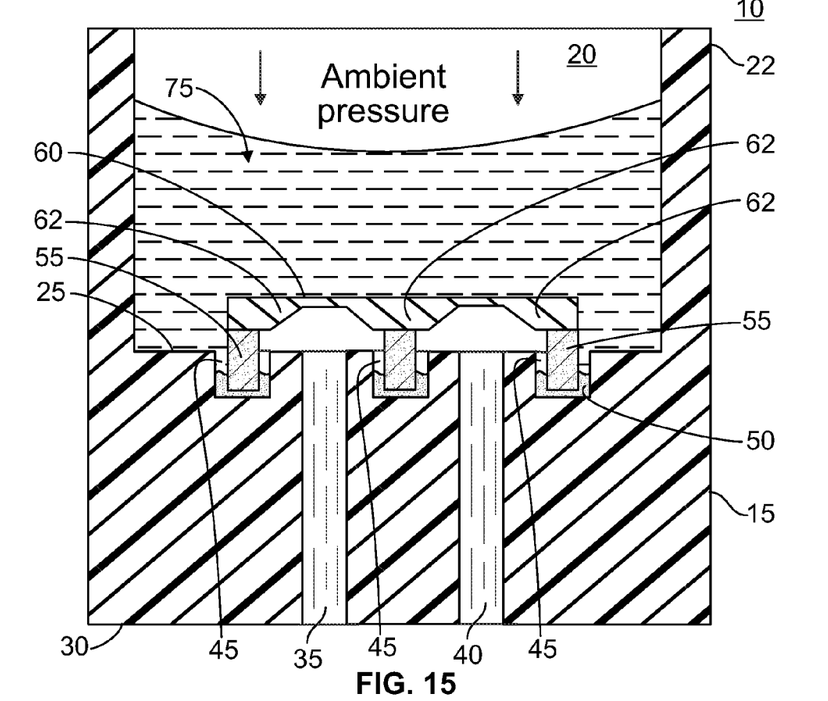
FIG. 15 is a cross sectional view of the preferred, dual differential pressure sensor, showing the addition of a viscous gel into the pocket; and, FIG. 16 is a top view of the single PRT die shown in FIG. 15 without showing protective passivation layers.
Figure 16:
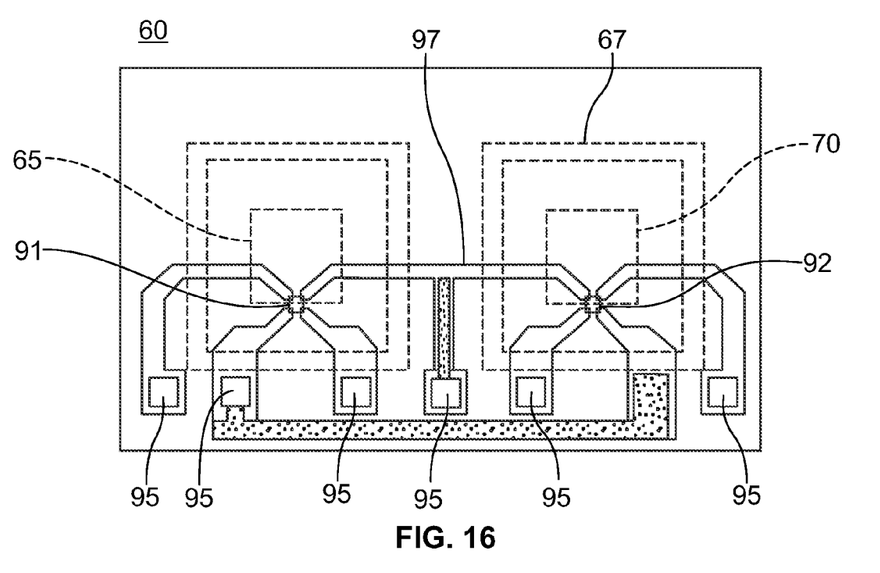

FIG. 15 is a cross sectional view of the preferred, dual differential pressure sensor, showing the addition of a viscous gel into the pocket. FIG. 16 is a top view of the PRT die 60 shown in FIG. 15 with passivation layers omitted to show circuitry 97. The passivation layers are ordinarily comprised of silicon dioxide or silicon nitride and are deposited on the die 60 to protect circuitry 97 formed into the die 60. The circuitry 97 revealed in FIG. 16 is omitted from FIGS. 1-15 for purpose of clarity.

When the housing 15 is assembled as shown in FIG. 15, the pedestal 55 is at least partially embedded in cured adhesive 50 such that separate seals are formed around each of the diaphragms 65 and 70, each of which provides a corresponding piezoresistive transducer 91 and 92. (See FIG. 16.) A dual differential pressure sensor is thus provided in a reduced-size housing 15, the size of which is significantly reduced while reducing the risk of adhesive 50 flowing into the ports and blocking them.

In FIG. 16, two piezoresistive transducers 91 and 92 (PRTs) are located proximate to an edge of corresponding thin diaphragms 65 and 70 formed into the silicon die 60. The broken-line squares 67 show the relative locations of the pedestal 55 beneath the die 60. Conductive circuit traces 97 are formed onto the surface of the die 60 to carry electrical signals to and from the PRTs 91 and 92 formed into the die 60 and the ASIC 74. A manufacturing process advantage is that a single PRT die 60 with two PRTs 91 and 92 can reduce eight bond pads for two individual PRT dies to six bond pads 95, which also reduces the number of connecting wires to the single PRT die from eight to six. Therefore, the die size can be also significantly reduced.

FIGS. 8 through 12 depict a single-sensor/single-port pressure sensor embodiment having a grooved structure for die mount and media sealing. FIG. 8 is a cross sectional view of the housing used with a single differential pressure sensor showing the housing prior to assembly of a pedestal. A single port 35 is completely surrounded by a groove 45 formed into the bottom 25 of a pocket 20 of an injection-molded housing 20.

Figure 9:
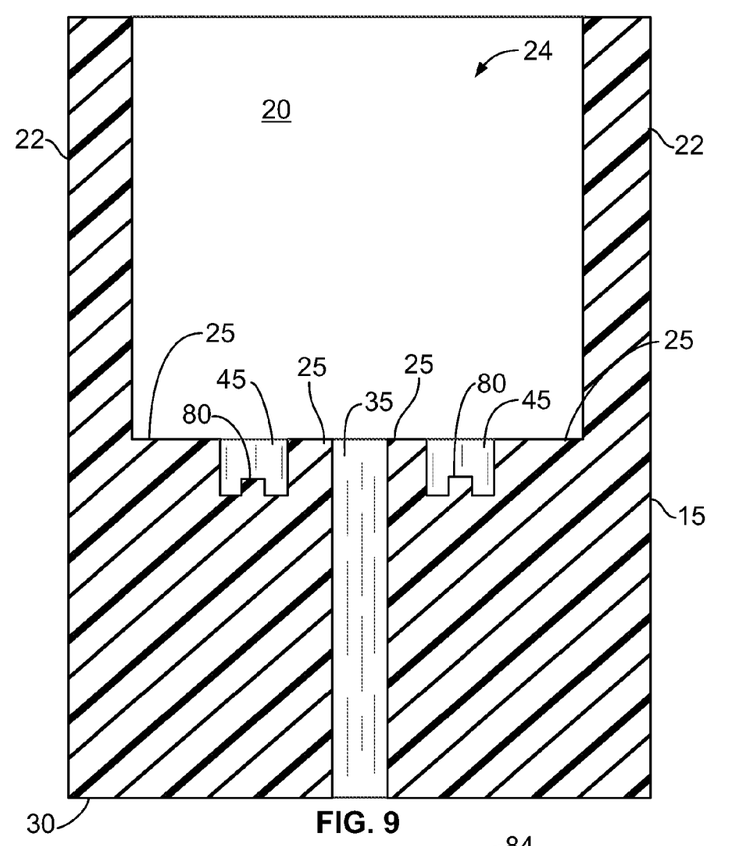
FIG. 9 is an alternate embodiment of a single, differential pressure sensor and also shows protrusions that extend upwardly from the bottom of the groove.
Figure 10:
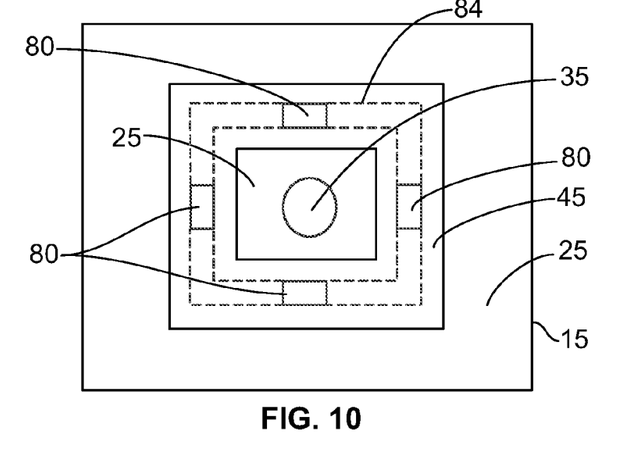
FIG. 10 is a top view of the device shown in FIG. 9 showing an example of where protrusions can be located in a groove.

FIG. 9 shows an alternate embodiment of a grooved structure for precise die mounting and media sealing in cross section. FIG. 10 is a top view of the structure shown in FIG. 9.

A single pressure port 35 is formed in the injection-molded housing 15 and extends through the bottom 25 surface of the pocket 20 to an exterior surface 30. The bottom surface of the groove 45 surrounding the port 35 has post-like protrusions 80 formed into the groove 45, which extend upwardly from the bottom of the groove 45 toward the bottom surface 25 of the pocket 20. The post-like protrusions 80 effectively provide a platform on which a pedestal 55 can rest after adhesive is added to the groove 45. Stated another way, the protrusions 80 prevents the adhesive 50 from being squeezed out from beneath the pedestal and helps to insure that some adhesive will remain between the bottom of the pedestal and the bottom of the groove. In addition to providing a fixed-height resting platform for the pedestal 55, the protrusions 80 also provide additional vertical surfaces to which an adhesive 50 can adhere to. The protrusions 80 thus improve the shear strength of the bond between the adhesive 50, the pedestal 55 and the side walls of the groove 45.

In an alternate embodiment, the post-like protrusions 80 are replaced by a continuous rail 84, illustrated in FIG. 10 by broken lines within the groove 45. The rail 84 extends upwardly from the bottom surface 25. It is preferably centered in the bottom of the groove 45 and extends around the port 35 and keeps the bottom of the pedestal 55 from contacting the bottom of the groove 45.

Figure 11:
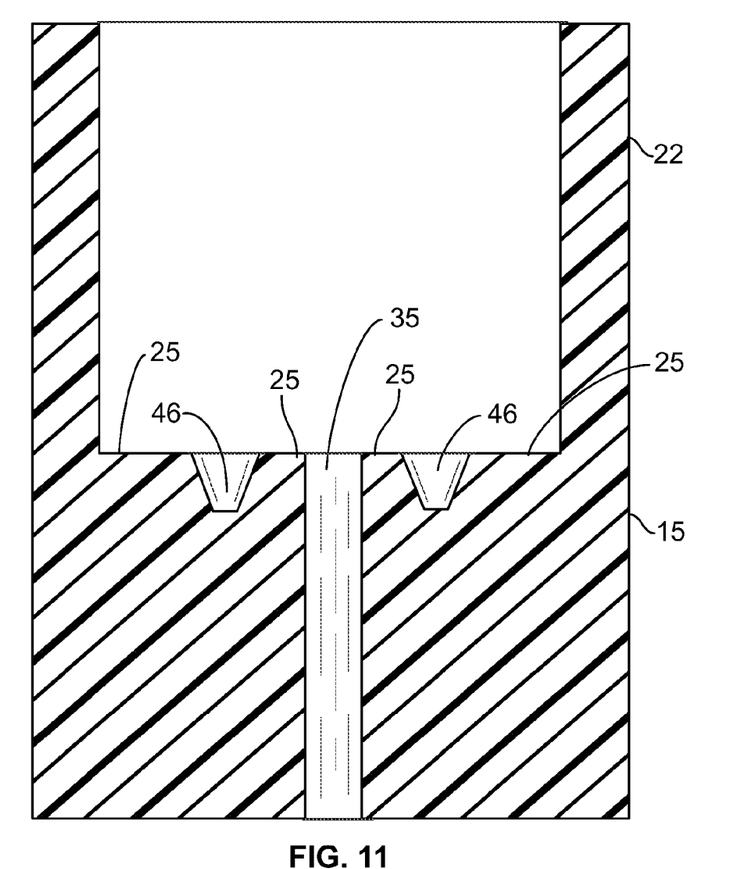
FIG. 11 is a cross sectional view of an alternate embodiment, showing a groove having a trapezoidal cross section.
Figure 12:
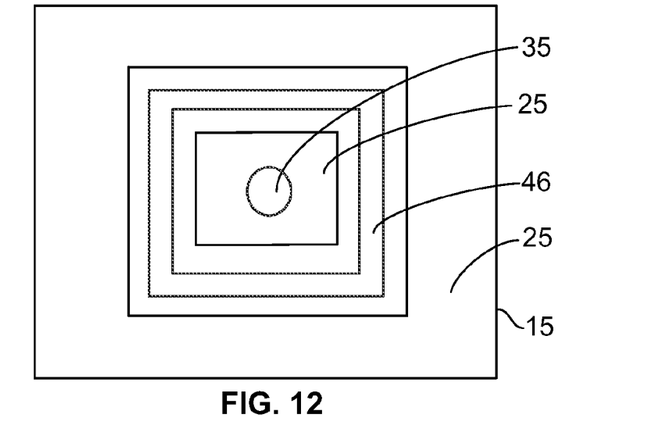
FIG. 12 is a top view of the structure shown in FIG. 11.

FIG. 11 is cross sectional view of an alternate embodiment of a single-port housing 15. FIG. 12 is a top view into the pocket of the housing shown in FIG. 11. These two figures depict an alternate embodiment of a groove 46 that can be used on either single PRT pressure sensors or multiple PRT pressure sensors.

As can be seen in FIG. 11, the groove 46 has a trapezoidal cross section. The trapezoidal-cross section groove is somewhat advantageous in that the volume of adhesive 50 deposited into the groove 46 is less likely to overflow due to the fact that the volume of the trapezoidal-shaped groove 46 increases significantly toward the bottom surface 25 of the pocket 20.

In the preferred embodiment, the adhesive 50 has an initial liquid state during which the viscosity is between about 0.3 and about 100 kilopoise. In its cured state, the adhesive 50 is substantially solid.

The grooves 45 and 46 have dimensions selected to allow the pedestal 50 to have a loose fit when installed therein. Stated another way, the width of a groove should be greater than the width of the pedestal walls to allow the pedestal to be freely and easily inserted into the groove and to at least partially embed itself within adhesive inside the groove 45 or 46.

In a preferred embodiment the pedestal is comprised of glass. In an alternate embodiment the pedestal is comprised of silicon.

While the groove 45 depicted in the FIGS. 3-8 has a substantially rectangular cross-sectional shape, the alternate embodiment of the groove shown in FIG. 11, has a trapezoidal cross-sectional shape 46. Other groove embodiments can be semi-circular cross-sections, or elliptical cross-sections as those of ordinary skill in the art will recognize.

In a preferred embodiment, the housing 15 including the groove 45 is formed from an injection molded plastic. In an alternate embodiment, the housing 15 is an injection molded plastic however, the groove 45 is machined. Material suitable for the housing includes thermal plastic polymer or "TPP".

The silicon die 60, which can carry one, two or more piezoresistive transducers 91 and 92, is attached to the pedestal using any one of anodic bonding, glass-frit bonding, and fusion bonding.

The foregoing description is for purposes of illustrations only. The true scope of the invention is set forth by the appurtenant claims.

What is claimed is:
1. A pressure sensor comprised of:
   a plastic housing have a pocket with a bottom comprised of a substantially planar surface;
   a pressure port extending through the bottom surface to an exterior surface of the housing;
   a groove formed into the bottom surface and surrounding the pressure port where the pressure port extends through the bottom surface;
   an adhesive within the groove;
   a pedestal within the groove and at least partially embedded into the adhesive; and a piezoresistive transducer (PRT) die, anodically bonded to the glass pedestal, the die having at least one piezoresistive transducer, responsive to pressure in the pressure port.

2. The apparatus of claim 1, wherein the die is attached to the pedestal by at least one of
anodic bonding;
glass frit bonding; and
fusion bonding.

3. The apparatus of claim 1, further comprising a gel within the pocket and covering the PRT die.

4. A pressure sensor comprised of:
a plastic housing have a pocket with a bottom comprised of a substantially planar surface;
a first pressure port extending through the bottom surface to an exterior surface of the housing;
a second pressure port extending through the bottom surface to the exterior surface of the housing;
a groove formed into the bottom surface whereby the first port and the second port are completely surrounded by the groove where the first and second ports extend through the bottom surface;
adhesive within and partially filling the groove such that adhesive completely surrounds each port;
a pedestal in the groove and at least partially embedded in the adhesive, the pedestal completely surrounding the first port and completely surrounding the second port, the pedestal being at least partially embedded within the adhesive; and
a piezoresistive transducer (PRT) die bonded to the pedestal, the die having a first PRT device responsive to pressure in the first port and a second PRT device responsive to pressure in the second port.

5. The apparatus of claim 4, wherein the adhesive has an initial, uncured liquid state and a cured state, the adhesive uncured liquid state having a viscosity between about 0.3 and about 100 kilopoise.

6. The apparatus of claim 1, wherein the pedestal is comprised of at least one of:
glass; and
silicon.

7. The apparatus of claim 1, wherein the groove has a cross sectional shape that is at least one of:
rectangular; and
trapezoidal.

8. The apparatus of claim 1, wherein the groove has a width and a bottom surface having a protrusion that extends above the bottom of the groove, the protrusion being sized, shaped and arranged to effectuate control the amount of adhesive between the pedestal and groove bottom.

9. The apparatus of claim 1, wherein the housing is an injection molded plastic.

10. The apparatus of claim 1, wherein the housing is an injection molded plastic and wherein the groove is a machined groove.

11. The apparatus of claim 1, wherein the housing is thermal plastic polymer.

12. The apparatus of claim 4, wherein the pedestal is comprised of at least one of;
glass; and
silicon.

13. The apparatus of claim 4, wherein the groove has a cross sectional shape that is at least one of
rectangular; and
trapezoidal.

14. The apparatus of claim 4, wherein the groove has a width and a bottom surface having a protrusion that extends above the bottom of the groove, the protrusion being sized, shaped and arranged to effectuate control the amount of adhesive between the pedestal and groove bottom.

15. The apparatus of claim 4, wherein the housing is an injection molded plastic.

16. The apparatus of claim 4, wherein the housing is an injection molded plastic and wherein the groove is a machined groove.

17. The apparatus of claim 4, wherein the housing is thermal plastic polymer.

* * * * *